United States Patent [19]
Hsu et al.

[11] Patent Number: 6,004,632
[45] Date of Patent: Dec. 21, 1999

[54] METHOD FOR INCREASING ETCH REMOVAL RATE OF SILICON OXYNITRIDE

[75] Inventors: Shih-Ying Hsu, Hsinchu; Chih-Hsiang Hsiao; Heng-Sheng Huang, both of Taipei, all of Taiwan

[73] Assignee: United Microelectronics Corp., Hsin-Chu, Taiwan

[21] Appl. No.: 08/992,674

[22] Filed: Dec. 17, 1997

[30] Foreign Application Priority Data

Sep. 23, 1997 [TW] Taiwan ................................. 86113776

[51] Int. Cl.$^6$ ....................................................... H05H 1/24
[52] U.S. Cl. ............................................. 427/579; 427/578
[58] Field of Search ..................................... 427/578, 579

[56] References Cited

U.S. PATENT DOCUMENTS

| | | | |
|---|---|---|---|
| 4,877,641 | 10/1989 | Dory ......................................... | 427/38 |
| 4,892,753 | 1/1990 | Wang et al. ............................... | 427/38 |
| 5,562,952 | 10/1996 | Nakahigashi et al. ................... | 427/534 |
| 5,593,741 | 1/1997 | Ikeda ........................................ | 427/579 |
| 5,753,044 | 5/1998 | Hanawa et al. .......................... | 118/723 |
| 5,851,603 | 12/1998 | Tsai et al. ................................. | 427/579 |

*Primary Examiner*—Shrive Beck
*Assistant Examiner*—Jennifer Calcagni
*Attorney, Agent, or Firm*—Finnegan, Henderson, Farabow, Garrett & Dunner, L.L.P.

[57] ABSTRACT

A method for depositing a silicon oxynitride layer that has a higher etch-removal rate. The deposition starts by first passing gas from a pipeline A into the deposition chamber before switching the RF power source on. The further is the delay in switching the RF power source on, the higher will be the etch-removal rate of the silicon oxynitride layer formed by the deposition. Furthermore, the RF power source will remain on for a short period after the pump starts pumping gas away from the deposition chamber through pipeline A at the end of the deposition. The sooner is the switching off of the RB power source after the pump start to operate, the higher will be the etch-removal rate of the silicon oxynitride layer that result from the deposition.

16 Claims, No Drawings

METHOD FOR INCREASING ETCH REMOVAL RATE OF SILICON OXYNITRIDE

BACKGROUND OF THE INVENTION

1. Field of Invention

The present invention relates to a method for forming a silicon oxynitride layer. More particularly, the present invention relates to a method for forming a silicon oxynitride layer that has a higher etch-removal rate in subsequent etching process. This is accomplished through changing some parameters during the deposition of silicon nitride.

2. Description of Related Art

Silicon oxynitride ($SiO_xN_y$) is a dielectric material that has properties ranging between silicon dioxide ($SiO_2$) and silicon nitride ($Si_3N_4$). The internal stress of a silicon oxynitride layer is smaller in magnitude than a silicon nitride layer, while its resistance against moisture and impurities is better than a silicon dioxide layer. Therefore, a silicon oxynitride layer is commonly employed as a protective material. To avoid any serious damages to the metallic layer above the devices due to a high processing temperature during silicon oxynitride deposition, a processing temperature lower than 450° C. is preferred. Hence, the silicon oxynitride layer is usually deposited using a plasma-enhanced chemical vapor deposition (PECVD) method with silane ($SiH_4$), nitrous oxide ($N_2O$), and nitrogen ($N_2$) as the reactive gases. The refractive index of silicon oxynitride is about 1.75, which is intermediate between silicon dioxide and silicon nitride. The refractive index is actually dependent upon the amount of oxygen and nitrogen inside the silicon oxynitride.

In photolithographic processing that uses deep ultra-violet (DUV) light source, depositing a thin layer of silicon oxynitride is a simple and economical way to form an anti-reflection layer (ARL). In general, the silicon oxynitride layer does not need to be removed. However, in performing a self-aligned silicide (Salicide) process, any coated silicon oxynitride layer must be completely removed.

Silicon oxynitride layer can be removed using hot phosphoric acid solution. However, prolonged exposure to phosphoric acid can damage the device's polysilicon layer and the substrate. Therefore, a faster etch-removal rate for the silicon oxynitride layer is very much preferred. The silicon oxynitride layer deposited using a conventional deposition method has a rather low etch-removal rate. Because of the slow etching rate, a few minutes of etching time is usually required to etch clean of any silicon oxynitride material. By the time the etching is finished, severe damages to the devices may result leading to a low product yield. On the other hand, if the etching time is shortened, residual silicon oxynitride will remain. This will adversely affect subsequent self-aligned silicide processing operation, which is equally detrimental to the device's reliability.

In light of the foregoing, there is a need in the art to improve the method of depositing silicon oxynitride to form silicon oxynitride layer.

SUMMARY OF THE INVENTION

Accordingly, the present invention is directed to provide a method for forming a silicon oxynitride layer that has a higher etch-removal rate. Through changing the depositing parameters in the deposition process, the resulting silicon oxynitride interface can be so improved that a higher etch-removal rate is obtained. Thus, the silicon oxynitride layer can be completely removed in a shorter time.

To achieve these and other advantages and in accordance with the purpose of the invention, as embodied and broadly described herein, the invention provides a method for forming a silicon oxynitride layer that has a higher etch-removal rate. Deposition of silicon oxynitride is carried out using a plasma-enhanced chemical vapor deposition (PECVD) process in a Novellus system. The deposition chamber of a Novellus system has a structure capable of simultaneous deposition of a plurality of wafers. In fact, there are six deposition stations in a depositing chamber. In the conventional silicon oxynitride deposition, two wafers are mounted at a time, and each wafer will go through three depositional steps. This is the so-called (2*3) method. However, this method will generate different thickness for the odd and even wafers. Therefore, a better method is to put a single wafer into the chamber at a time and perform deposition in six steps. This is the so-called (1*6) method. Through this arrangement, uniform thickness can be obtained for each wafer. The same source of gas is used between depositional steps inside the deposition chamber. However, when the wafer change stations, due to a change in the concentration of reactive gases, an interface will be produced. The existence of an interface will lower the etch-removal rate of hot phosphoric acid solution on the silicon oxynitride layer. In this invention, certain parameters affecting the deposition is changed such that the effect of a silicon oxynitride interface on the etch-removal rate by hot phosphoric acid is reduced to at a minimal, therefore the etch-removal rate is correspondingly increased.

The Novellus system used for depositing silicon oxynitride divides the reactive gases into two pipeline groups, A and B. Silane ($SiH_4$) flows in pipeline A, while nitrous oxide ($N_2O$) flows in pipeline B. Reactive gas in pipeline A will flow into the deposition chamber only when deposition has started. When the system is idling, the reactive gas will flow directly to a pump and be taken away. The reactive gas in pipeline B, however, will start flowing into the deposition chamber as soon as the deposition parameter are input to the machine.

The design in this invention is to drive the reactive gas in pipeline system A into the deposition chamber first, before switching the RF power source on. It has been discovered that the longer the delay in switching the RF power source on, the lesser will be the effect on the subsequent etch-removal rate of the deposited silicon oxynitride interface. This delay period forms the first time parameter of this invention. On the other hand, after the deposition has finished, the reactive gas in deposition chamber needs to be pumped away through pipeline A. It has been discovered that if the period RF power source remains on as soon as the pump starts pumping away the gas is shorter, the lesser will be the effect on the subsequent etch-removal rate of the deposited silicon oxynitride interface. This period forms the second time parameter of this invention The reason for this is that the higher the silane/nitrous oxide ratio, the higher will be the etch-removal rate of the silicon oxynitride layer thus formed. By varying the two time parameters, the RF power source is switched on for a correct period before and after the deposition, and gases are allowed to react in the right concentration levels. Therefore, the deposited interface layer will have less effect on its subsequent etch-removal rate.

It is to be understood that both the foregoing general description and the following detailed description are exemplary, and are intended to provide further explanation of the invention as claimed.

DESCRIPTION OF THE PREFERRED EMBODIMENTS

A plasma-enhanced chemical vapor deposition (PECVD) method is used for the deposition of silicon oxynitride. The deposition is carried out inside the deposition chamber of a Novellus system. The deposition chamber comprises a plurality of wafer holders, and each chamber has six deposition stations. Only a single wafer is placed inside the deposition station each time, and six deposition steps are performed known as a (1*6) method. Through this arrangement, a uniform thickness can be obtained for each of the wafers. Although all the stations deposit silicon oxynitride layer, when the wafer change station to start another deposition step, an interface layer will be generated due to a change in the gas concentration inside the deposition chamber. The presence of an interface layer will lower the etch-removal rate of the silicon oxynitride layer.

The gas in pipeline A will flow into the deposition chamber only when the deposition starts, otherwise, the gas will flow directly to a pump and then pumped away. On the other hand, the gas in pipeline B will start to flow into the deposition chamber as soon as the deposition conditions are set. The gas in pipeline A is silane, while the gas flowing in pipeline B is nitrous oxide. Two time parameters are defined in this invention, namely, preA and postA. The parameter preA refers to the time difference from the time when the RF power source is switched on to the time when the reactive gas in pipeline A starts to flow into the deposition chamber. When the value of preA is negative, it means that gas in pipeline A starts to flow into the deposition chamber before the RF power source is switched on. When the value of preA is positive, it means that the RF power source is switched on for a period before gas in pipeline A starts to flow into the deposition chamber. The second parameter postA is defined as time difference from the time when the gas in the deposition chamber starts to be pumped out through pipeline A to the time when the RF power source originally on is switched off. By varying the parameters preA and postA, the deposited silicon oxynitride layer will have an interface layer having different equivalent etching thickness. An equivalent etching thickness for the interface is defined to be an equivalent period of etching time for the thin film layer, in this case, a silicon oxynitride layer. The values of the equivalent etching thickness of the interface layer for different preA and postA values are shown in Table 1 below.

TABLE 1

| | PreA | PostA | Equivalent etching thickness of interface layer (Å) |
|---|---|---|---|
| 1 | −0.5 | 0.5 | 48 |
| 2 | −0.5 | 1 | 77 |
| 3 | −1.5 | 1 | 35 |
| 4 | 0.5 | 1 | 125 |

From Table 1, it can be observed that the earlier the gas is allowed to flow from pipeline A into the deposition chamber before RF power source is switched on, the lesser will be the equivalent etching thickness for the interface layer formed on the silicon oxynitride surface. In other word, the more negative the value of preA is, the lesser will be the equivalent etching thickness (Å). Consequently, the effect of the interface layer on the etch-removal rate of hot phosphoric acid is reduced to a minimum. The optimal range for the value of preA runs from −2 to 1 seconds. Alternately, when the deposition is finished and gas in the deposition chamber starts to be pumped out through pipeline A, the shorter the RF power source that remains on, the smaller will be the equivalent etching thickness of the interface layer. In other word, the smaller the value of postA, the lesser will be the equivalent etching thickness (Å). The optimal range for the value of postA runs from 0 to 2 seconds.

Furthermore, a comparison of the (2*3) and the (1*6) methods reveal that for a nine minutes etching, the etched thickness of the silicon oxynitride layer produced by a (2*3) method is 492 Å while that produced by a (1*6) method is 610 Å. In other word, thin film deposited by the (1*6) method has an etch-removal rate of 68 Å/min, but thin film deposited by the (2*3) method has an etch-removal rate of 55 Å/min only. Clearly, the etch-removal rate of thin films obtained from a (1*6) method is better than from a (2*3) method.

As a summary, one characteristic of this invention is the passing of gas from pipeline A into the deposition chamber before switching on the RF power source. The longer this delaying period is, the higher will be the etch-removal rate of the silicon oxynitride layer deposited out by this method. The second characteristic of this invention is the continued switching on of the RF power source for a short period after gas in the deposition chamber starts to be pumped out through pipeline A. The shorter the RF power source remains on after the completion of the deposition process, the higher will be the etch-removal rate of the silicon oxynitride layer deposited by this method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for operating a system for depositing a silicon oxynitride layer on a substrate, the system having a deposition chamber, a pump and a RF power source, the method comprising the steps of:

a) passing a first gas into the deposition chamber;

b) passing a second gas into the deposition chamber, switching on the RF power source, and fixing a first time difference between passing the second gas into the deposition chamber and switching the RF power source on, the first gas reacting with the second gas to form the silicon oxynitride layer;

c) pumping the second gas out of the deposition chamber by the pump, and controlling a second time difference between the start of pumping the second gas out of the deposition chamber and the time until which the RF power source is turned off after said start of pumping; and d) repeating steps a) through c), wherein the first time difference remains fixed and the second time difference is varied.

2. The method of claim 1, wherein the system is one that is capable of simultaneous deposition of a plurality of substrates.

3. The method of claim 1, wherein the second gas includes silane.

4. The method of claim 1, wherein the first time difference is between −2 to 1 seconds.

5. The method of claim 1, wherein the second time difference is between 0 to 2 seconds.

6. The method of claim 1, wherein the first gas includes nitrous oxide.

7. The method of claim 1, wherein the RF power source is switched on after the second gas is passed into the deposition chamber.

8. The method of claim 1, wherein the steps are repeated six times.

9. A method for operating a system for depositing a silicon oxynitride layer on a substrate, the system having a deposition chamber, a pump and a RF power source, the method comprising the steps of:

a) passing a first gas into the deposition chamber;

b) passing a second gas into the deposition chamber, switching on the RF power source, and controlling a first time difference between passing the second gas into the deposition chamber and switching the RF power source on, the first gas reacting with the second gas to form the silicon oxynitride layer;

c) pumping the second gas out of the deposition chamber by the pump, and fixing a second time difference between the start of pumping the second gas out of the deposition chamber and the time until which the RF power source is tuned off after said start of pumping: and d) repeating steps a) through c), wherein the first time difference is varied and the second time difference remains fixed.

10. The method of claim 9, wherein the steps outlined in the deposition of the silicon oxynitride is repeated six times.

11. The method of claims wherein the system is one that is capable of simultaneous deposition of a plurality of substrates.

12. The method of claim 9, wherein the second gas includes silane.

13. The method of claim 10, wherein the first time difference is between −2 to 1 seconds.

14. The method of claim 10, wherein the second time difference is between 0 to 2 seconds.

15. The method of claim 10, wherein the first gas includes nitrous oxide.

16. The method of claim 10, wherein the RF power source is switched on after the second gas is passed into the deposition chamber.

* * * * *